(12) United States Patent
Chen (10) Patent No.: US 6,818,922 B2
(45) Date of Patent: Nov. 16, 2004

(54) THIN FILM TRANSISTOR ARRAY AND DRIVING CIRCUIT STRUCTURE

(75) Inventor: Hsin-Ming Chen, Hsinchu (TW)

(73) Assignee: Toppoly Optoelectronics Corp. (TW)

( * ) Notice: Subject to any disclaimer, the term of this patent is extended or adjusted under 35 U.S.C. 154(b) by 0 days.

(21) Appl. No.: 10/249,342

(22) Filed: Apr. 2, 2003

(65) Prior Publication Data

US 2004/0099863 A1 May 27, 2004

(30) Foreign Application Priority Data

Nov. 22, 2002 (TW) ........................................ 91134042 A (51) Int. Cl.⁷ ............................................. H01L 29/786
(52) U.S. Cl. ............................ 257/66; 257/72; 438/164
(58) Field of Search ............................. 257/66, 69, 72, 257/351; 438/151, 154, 164

(56) References Cited

U.S. PATENT DOCUMENTS 5,142,344 A * 8/1992 Yamazaki .................... 257/66
5,318,919 A * 6/1994 Noguchi et al. ............ 438/166
5,767,530 A * 6/1998 Ha ............................... 257/72
6,608,326 B1 * 8/2003 Shinagawa et al. .......... 257/64
2002/0154252 A1 * 10/2002 Toyota et al. ................. 349/38

* cited by examiner

Primary Examiner—Carl Whitehead, Jr.
Assistant Examiner—Stephen W. Smoot
(74) Attorney, Agent, or Firm—Liu & Liu (57) ABSTRACT

A thin film transistor array and driving circuit structure fabricated on a substrate. The structure comprises a plurality of scanning lines, a plurality of signaling lines, a plurality of thin film transistors, a plurality of pixel electrodes, a plurality of storage capacitors and a plurality of CMOS transistors. Each thin film transistor includes a polysilicon layer, a source/drain terminal, an N+ doped thin film, a gate and a gate insulation layer. The polysilicon layer is formed on the substrate and the source/drain terminal is formed over the polysilicon layer. The N+ doped thin film is positioned between the polysilicon layer and the source/drain terminal. The gate is formed over the polysilicon layer and the gate insulation layer is positioned between the polysilicon layer and the gate.

28 Claims, 11 Drawing Sheets

THIN FILM TRANSISTOR ARRAY AND DRIVING CIRCUIT STRUCTURE

CROSS REFERENCE TO RELATED APPLICATIONS

This application claims the priority benefit of Taiwan application serial no. 91134042, filed Nov. 22, 2002.

BACKGROUND OF INVENTION

1. Field of Invention

The present invention relates to a thin film transistor array and driving circuit structure. More particularly, the present invention relates to a thin film transistor array and driving circuit structure that can be fabricated in six masking steps.

2. Description of Related Art

In recent years, the rapid advance in the fabrication of semiconductor devices and display devices has lead to the popularization of multimedia systems. Due to the production of high-quality and low-cost displays such as cathode ray tubes, these displays now represent a large chunk in the display market. However, from the standpoint of a desktop display user or an environmentalist, a cathode ray tube is bulky, consumes a lot of energy and is also a source of radiation. Since a lot of material is required to fabricate each cathode ray tube and a lot of energy is wasted in its operation, other types of displays including thin film transistor liquid crystal display (TFT-LCD) have been developed as a substitute. A conventional TFT-LCD is a slim and compact display capable of producing high-quality images. Each TFT-LCD uses very little energy and is virtually radiation-free. All these advantages have championed the TFT-LCD in the mainstream display market.

In general, a thin film transistor may be classified as an amorphous thin film transistor or a polysilicon thin film transistor. A polysilicon thin film transistor fabricated using a low-temperature polysilicon (LTPS) technique is different from an amorphous thin film transistor using an amorphous silicon (a-Si) technique. The LTPS transistor has an electron mobility greater than 200 $cm^2$/V-sec and hence the thin film transistor can have a smaller dimension, a larger aperture ratio and a lower power rating. In addition, the LTPS process also permits the concurrent fabrication of a portion of the driving circuit and the thin film transistor in the same substrate so that the subsequently formed liquid crystal display panel has a greater reliability and a lower average production cost.

Figure 1A:
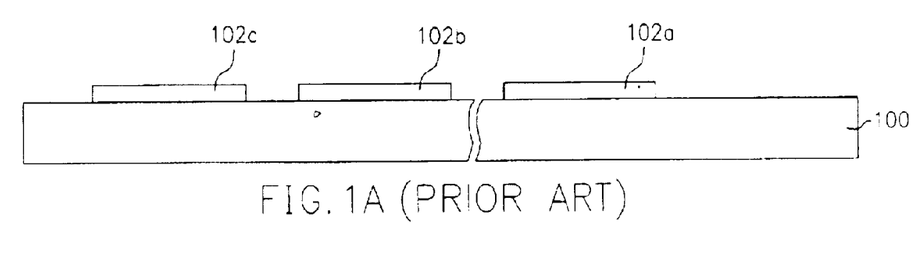
FIGS. 1A to 1H are schematic cross-sectional views showing the progression of steps for fabricating a conventional thin film transistor array and driving circuit.

FIGS. 1A to 1H are schematic cross-sectional views showing the progression of steps for fabricating a conventional thin film transistor array and driving circuit. As shown in FIG. 1A, a substrate 100 is provided. A polysilicon layer is formed over the substrate 100. Thereafter, the polysilicon layer is patterned using a first masking process (Mask 1) so that a plurality of poly-islands 102a, 102b and 102c are formed over the substrate 100. The poly-island 102a is a location for forming a thin film transistor while the poly-islands 102b and 102c are locations for forming a driving circuit such as a complementary metal-oxide-semiconductor (CMOS) circuit. Since the poly-island 102a is eventually transformed into a thin film transistor, poly-islands 102a are normally positioned on top of the substrate 100 as an array. Similarly, since the poly-islands 102b and 102c are eventually transformed into driving circuits, the poly-islands 102b and 102c are normally positioned close to the peripheral region of the substrate 100.

Figure 1B:
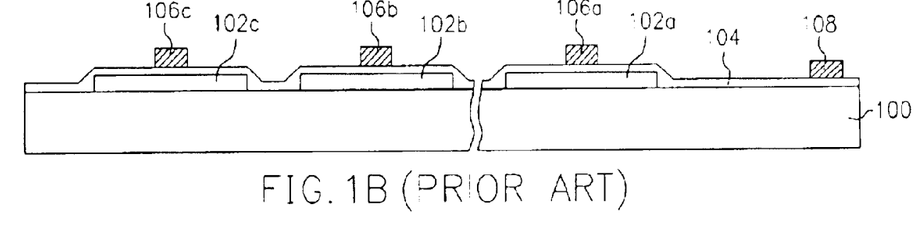

As shown in FIG. 1B, a first dielectric layer 104 and a conductive layer (not shown) are sequentially formed over the substrate 100 with the poly-islands 102a, 102b and 102c thereon. The conductive layer is patterned using a second masking process (Mask 2) to form gates 106a, 106b and 106c over the poly-islands 102a, 102b and 102c respectively and the lower electrode 108 of a storage capacity on a suitable location on the substrate 100.

Figure 1C:
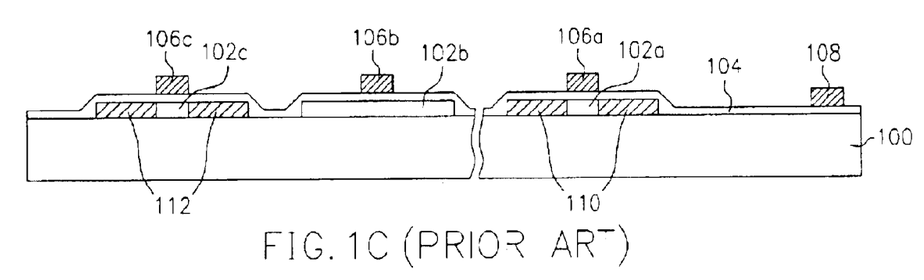

As shown in FIG. 1C, N+ doped regions 110 and N+ doped regions 112 are patterned out inside the island 102a and the island 102c using a third masking process (Mask 3). The N+ doped regions 110 inside the island 102a is located on each side of the gate 106a and the N+ doped regions 112 inside the island 102c are located on each side of the gate 106c.

Figure 1D:
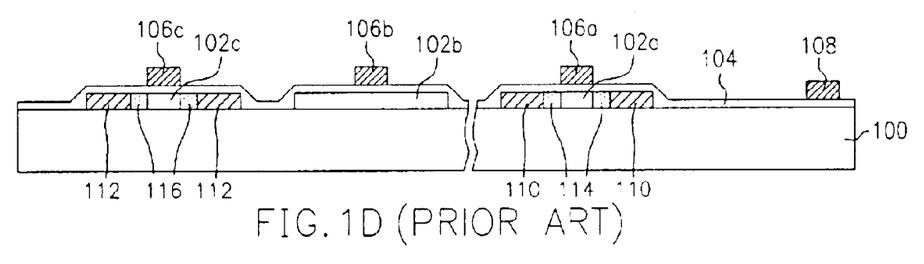

As shown in FIG. 1D, N– doped regions 114 are patterned inside the island 102a and N– doped regions 116 are patterned inside the island 102c using a fourth masking process (Mask 4). Each N– doped region 114 inside the island 102a is located between the gate 106a and one N+ doped region 110. Similarly, each N– doped region 116 inside the island 102c is located between the gate 106c and one N+ doped region 112.

Figure 1E:
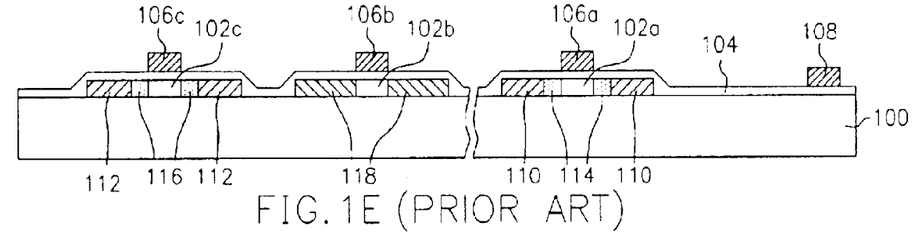

As shown in FIG. 1E, P+ doped regions 118 are patterned inside the island 102b using a fifth masking process (Mask 5). The P+ doped regions 118 inside the island 102b are located on each side of the gate 106b.

Figure 1F:
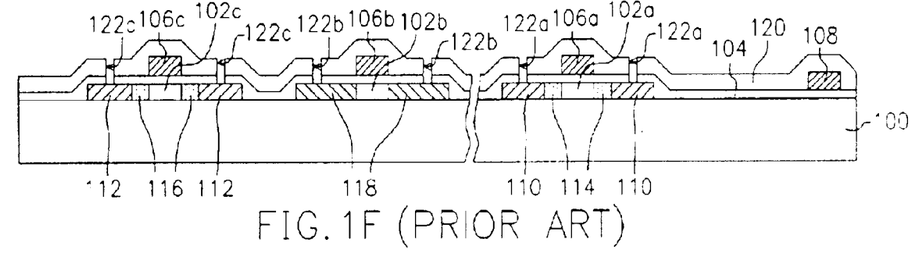

As shown in FIG. 1F, a second dielectric layer 120 is formed over the substrate 100. Thereafter, the first dielectric layer 104 and the second dielectric layer 120 are patterned using a sixth masking process (Mask 6) to form openings 122a, 122b and 122c. The opening 122a exposes the N+ doped region 110, the opening 122b exposes the P+ doped region 118 and the opening 122c exposes the N+ doped region 112.

Figure 1G:
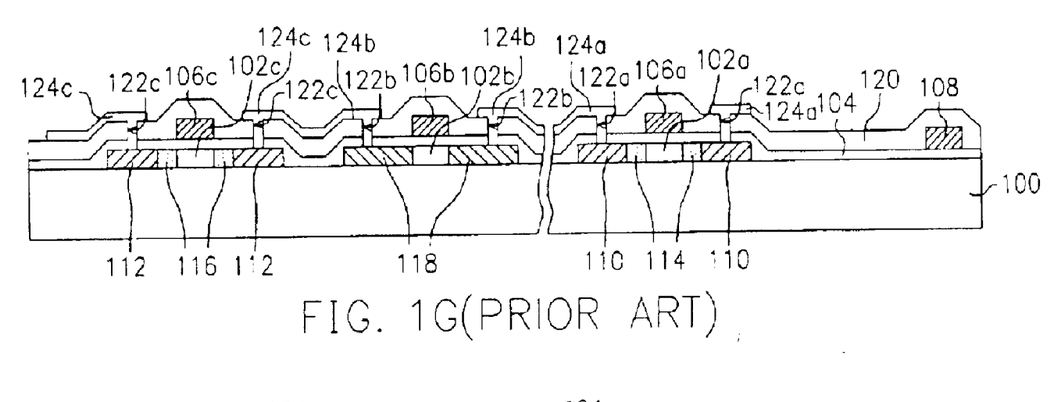

As shown in FIG. 1G, a conductive layer (not shown) is formed over the second dielectric layer 120. Thereafter, the conductive layer is patterned using a seventh masking process (Mask 7) to form source/drain terminals 124 (comprising 124a, 124b and 124c respectively). The source/drain terminals 124 are electrically connected to the N+ doped region 110, the P+ doped region 118 and the N+ doped region 112 through the opening 122a, the opening 122b and the opening 122c respectively.

Figure 1H:
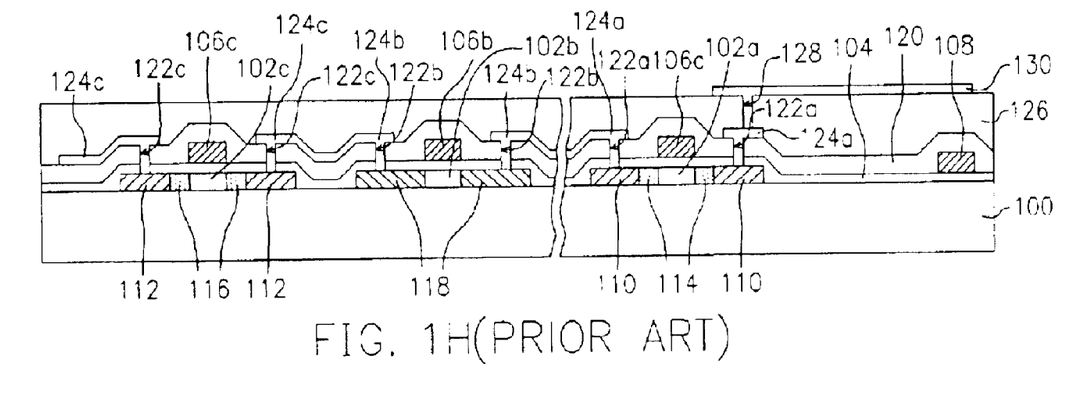

As shown in FIG. 1H, a planarization layer 126 is formed over the substrate 100 with the source/drain terminals 124 thereon. Thereafter, the planarization layer 126 is patterned using an eighth masking process (Mask 8) to form an opening 128 for exposing the source/drain terminal 124a. After patterning the planarization layer 126, a conductive layer (not shown) is formed over the substrate 100. The conductive layer is a transparent layer typically made from indium-tin-oxide material. The conductive layer is patterned using a ninth masking process (Mask 9) to form a pixel electrode 130.

As shown on the left side of FIG. 1H, the N– doped region 116 and the N+ doped region 112 inside the island 102c, the gate 106c and the source/drain terminal 124c together constitute an N-type metal-oxide-semiconductor (NMOS) transistor. The P+ doped region 18 inside the island 102b, the gate 106b and the source/drain terminal 124b together constitute a P-type metal-oxide-semiconductor (PMOS) transistor. The NMOS transistor and the PMOS transistor together constitute a complementary metal-oxide-semiconductor (CMOS) transistor. The CMOS transistor on the substrate 100 is a driving circuit for driving the thin film transistor on the right side of FIG. 1H and hence controlling the pixel display.

As shown on the right side of FIG. 1H, the N− doped region 110 and the N+ doped region 114 inside the island 102a, the gate 106a and the source/drain terminal 124a together constitute a polysilicon thin film transistor (poly-TFT). The writing of data into the pixel electrode 120 of the thin film transistor is driven and controlled by the CMOS.

Figure 2:
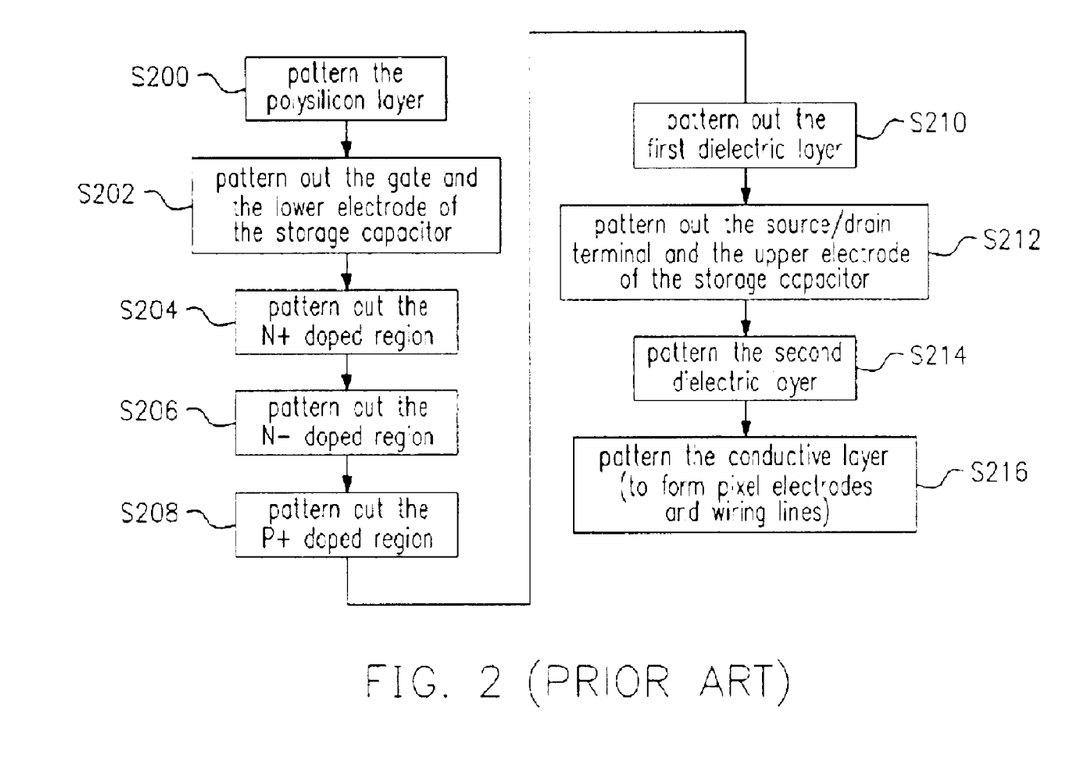
FIG. 2 is a flow chart showing the steps for fabricating a conventional thin film transistor array and driving circuit.

FIG. 2 is a flow chart showing the steps for fabricating a conventional thin film transistor array and driving circuit. As shown in FIG. 2, the process of fabricating the thin film transistor array and the driving circuit includes: patterning a polysilicon layer (S200); patterning out a gate and the lower electrode of a storage capacitor (S202); patterning out a N+ doped region (S204), patterning out an N− doped region (S206); patterning out a P+ doped region (S208), patterning out a first dielectric layer (S210); patterning out source/drain terminals and the upper electrode of the storage capacitor (S212); patterning a second dielectric layer (S214) and patterning out a pixel electrode (S216).

To fabricate the structure of a conventional thin film transistor array and driving circuits, as much as eight masking steps (not including the fabrication of the N− doped regions 114 and 116) or nine masking steps are required. This leads to a relatively high production cost. In addition, the greater number of masking steps also leads to a longer production time and a lower production yield.

SUMMARY OF INVENTION

Accordingly, one object of the present invention is to provide a thin film transistor array and driving circuit structure that can be fabricated in only six masking steps.

To achieve these and other advantages and in accordance with the purpose of the invention, as embodied and broadly described herein, the invention provides a thin film transistor array and driving circuit structure fabricated on a substrate. The structure mainly comprises a plurality of scanning lines, a plurality of signal lines, a plurality of thin film transistors, a plurality of pixel electrodes, a plurality of storage capacitors and a plurality of complementary metal-oxide-semiconductor (CMOS) transistors.

In this invention, the thin film transistor comprises a polysilicon layer, a source/drain terminal, an N+ doped thin film, a gate and a gate insulation layer. The polysilicon layer is formed over the substrate and the source/drain terminal is formed over the polysilicon layer. The N+ doped thin film is positioned between the polysilicon layer and the source/drain terminal. The gate is formed over the polysilicon layer and the gate insulation layer is positioned between polysilicon layer and the gate.

In this invention, the pixel electrode and the storage capacitor are formed on the substrate to correspond with the thin film transistor.

In this invention, the CMOS transistor includes an N-type metal-oxide-semiconductor (NMOS) transistor and a P-type metal-oxide-semiconductor (PMOS) transistor. The NMOS transistor comprises a polysilicon layer, a source/drain terminal, a N+ doped thin film, a gate and a gate insulation layer. The polysilicon layer is formed over the substrate and the source/drain terminal is formed over the polysilicon layer. The N+ doped thin film is positioned between the polysilicon layer and the source/drain terminal. The gate is formed over the polysilicon layer and the gate insulation layer is positioned between the polysilicon layer and the gate. In addition, the polysilicon layer between the gate and the source/drain terminal may further include an N− doped region.

The PMOS transistor comprises a polysilicon layer, a source/drain terminal, a P+ doped thin film, a gate and a gate insulation layer. The polysilicon layer is formed over the substrate and the source/drain terminal is formed over the polysilicon layer. The P+ doped thin film is positioned between the polysilicon layer and the source/drain terminal. The gate is formed over the polysilicon layer and the gate insulation layer is positioned between the polysilicon layer and the gate.

The aforementioned gate insulation layer includes at least one first dielectric layer. The first dielectric layer is made from a material such as silicon oxide, silicon nitride or hydrogen-containing dielectric material. In addition, the gate insulation layer may include at least one first dielectric layer and one second dielectric layer. The first dielectric layer is made from a material such as silicon oxide, silicon nitride or hydrogen-containing dielectric material. The second dielectric layer is made from a material such as a photosensitive resin.

In this invention, the gate is made from a material such as an aluminum/molybdenum alloy or an aluminum/titanium alloy. The source/drain terminal is made from a material such as an aluminum/molybdenum alloy or pure molybdenum.

For a transparent type of panel, the conductive layer can be made from a transparent conductive material such as indium-tin oxide. For a reflective type of panel, the conductive layer can be made from a metallic material with good reflective properties. In addition, the surface of a passivation layer underneath the conductive layer may be roughened to boost reflectivity of light from the conductive layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 3A:
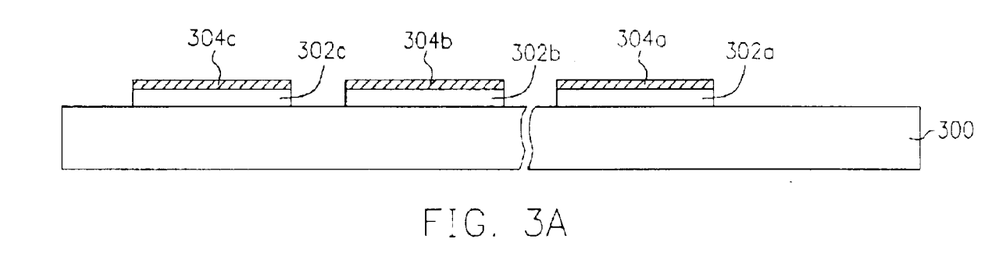
FIGS. 3A to 3I are schematic cross-sectional views showing the progression of steps for fabricating a thin film transistor array and driving circuit according to one preferred embodiment of this invention.

FIGS. 3A to 3I are schematic cross-sectional views showing the progression of steps for fabricating a thin film transistor array and driving circuit according to one preferred embodiment of this invention. As shown in FIG. 3A, a substrate 300 is provided. A polysilicon layer and an N+ doped thin film are sequentially formed over the substrate 300. Thereafter, the polysilicon layer and the N+ doped thin film are patterned in a first masking process (Mask 1) to form a plurality of poly-islands comprising N+ doped thin films 304a, 304b, 304c stacked over c 302a, 302b, 302c respectively.

The poly-islands is formed, for example, by forming an amorphous thin film (a-Si) over the substrate 300 and then conducting an excimer laser annealing (ELA) operation on the amorphous layer so that the amorphous silicon crystallizes into a polysilicon layer. The N+ doped thin film is formed, for example, by depositing amorphous silicon with N+ dopants directly onto the substrate 300 in a chemical vapor deposition. Alternatively, an amorphous silicon thin film is formed over the substrate 300 followed by implanting N+ dopants into the amorphous silicon layer.

The poly-island 302a is an area for forming a thin film transistor (TFT) and the poly-islands 302b and 302c are areas for forming a driving circuit such as a CMOS circuit. Since the island 302a is the location for forming a thin film transistor, a plurality of islands like the poly-island 302a is positioned as an array over the substrate 300. On the other hand, the poly-islands 302b and 302c are mostly positioned on the peripheral or surrounding region of the substrate 300.

Figure 3B:
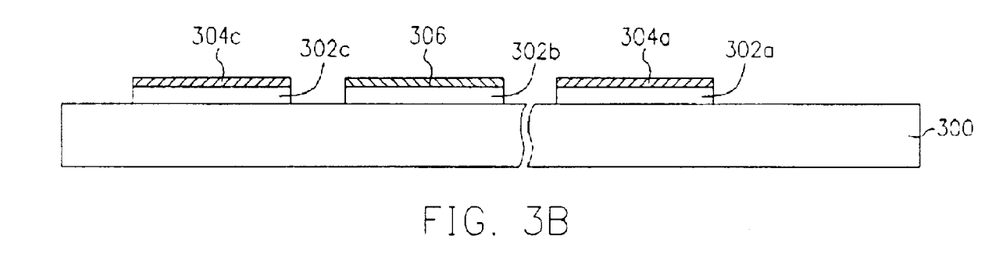
Figure 3C:
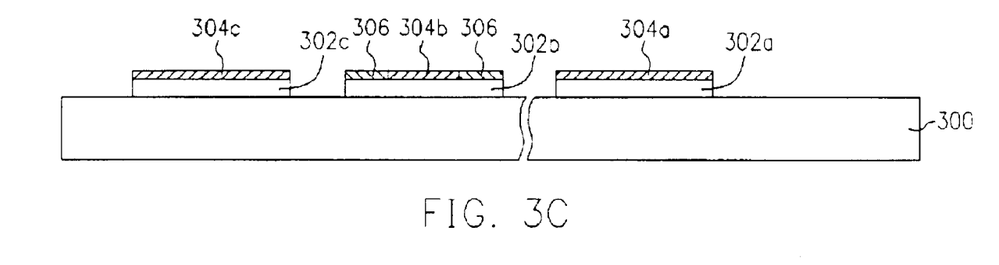

A P+ doped region 306 is formed inside the entire N+ doped thin film 304b (as shown in FIG. 3B) or inside a portion of the N+ doped thin film 304b (as shown in FIG. 3C) by implanting P-type ions in a second masking process (Mask 2).

Figure 3D:
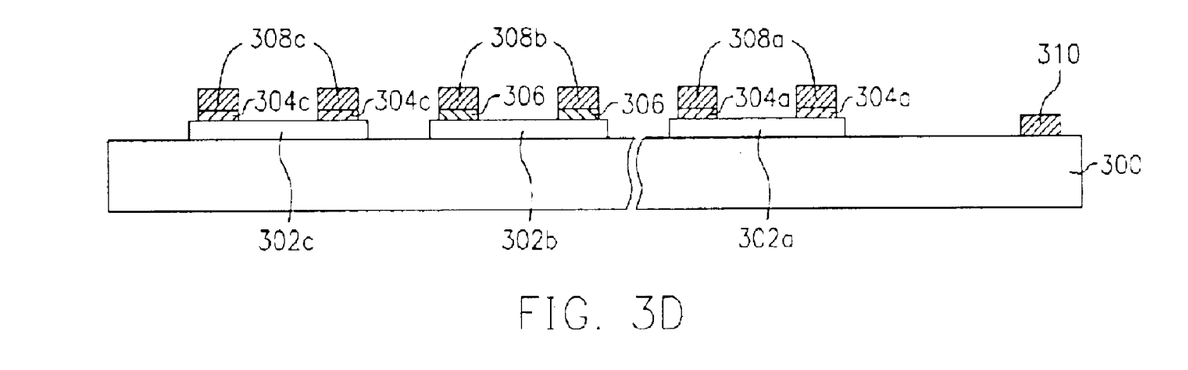

As shown in FIG. 3D, a first conductive layer (not shown) is formed over the substrate 300. The first conductive layer is patterned in a third masking process (Mask 3) to form source/drain terminals 308a, 308b, 308c over the N+ doped thin film 304a, the P+ doped region 306 and the N+ doped thin film 304c respectively and the lower electrode 310 of a storage capacitor on a suitable location on the substrate 300.

However, concurrent with the patterning of the first conductive layer, the third masking process may include the patterning of the N+ doped thin film 304a, 304b, 304c or the P+ doped region 306 (as shown in FIGS. 3B and 3C) underneath the first conductive layer. Thus, the source/drain terminals 308a and the N+ doped thin films 304a underneath have an identical pattern. Similarly, the source/drain terminals 308b and the P+ doped region 306 underneath have an identical pattern and the source/drain terminals 308c and the N+ doped thin film 304c underneath have an identical pattern.

Figure 3E:
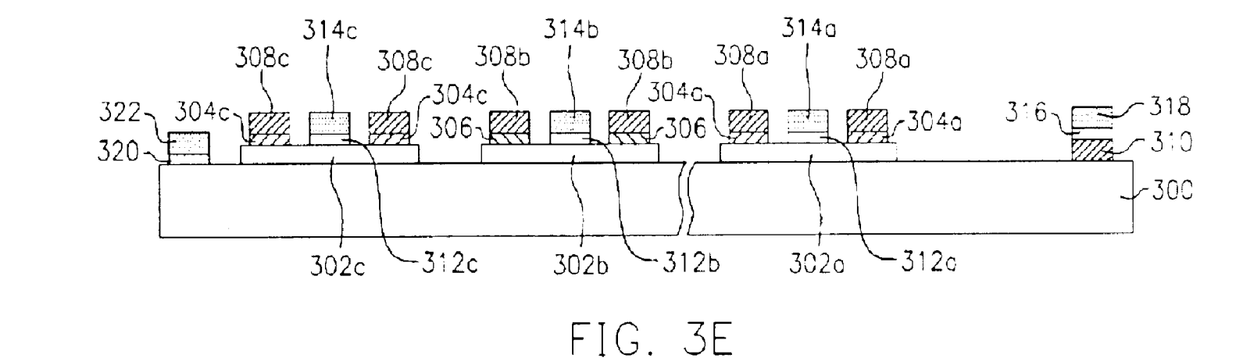

As shown in FIG. 3E, a first dielectric layer (not shown) and a second conductive layer (not shown) are sequentially formed over the substrate 300. Thereafter, the first dielectric layer and the second conductive layer are patterned in a fourth masking process (Mask 4) to form stack structures comprising gates 314a, 314b, 314c over corresponding gate insulation layers 312a, 312b, 312c on the respective poly-silicon layers 302a, 302b and 302c.

In this embodiment, a rapid thermal process (RTP) may be carried out after forming the gate insulation layers 312a, 312b and 312c to improve their material quality.

The gate insulation layers 312a, 312b and 312c comprise at least one dielectric layer. The gate insulation layers are fabricated using a material such as silicon oxide, silicon nitride or hydrogen-containing dielectric material. However, the gate insulation layers 312a, 312b, 312c may comprise at least a first dielectric layer and a second dielectric layer. The first dielectric layer is fabricated using a material such as silicon oxide, silicon nitride or hydrogen-containing dielectric material and the second dielectric layer is fabricated using a material such as a photosensitive resin. In addition, the gates 314a, 314b, 314c are fabricated using a material such as an aluminum/molybdenum alloy or an aluminum/titanium alloy and the source/drain terminals 308a, 308b, 308c are fabricated using a material such as an aluminum/molybdenum alloy or molybdenum.

The fourth masking process (Mask 4) also produces a dielectric layer 316 and an upper electrode 318 over the lower electrode 310. The lower electrode 310, the dielectric layer 316 and the upper electrode 318 together constitute a storage capacitor. In addition, the fourth masking process (Mask 4) also produces stack structures comprising a wiring line 322 over a dielectric layer 320 in suitable locations over the substrate 300.

Furthermore, the fabricating sequence for forming the gates 314a, 314b, 314c and the source/drain terminals 308a, 308b, 308c may be adjusted according to demand. In other words, forming the gates 314a, 314b, 314c or the source/drain terminals 308a, 308b, 308c first matters very little.

Figure 3F:
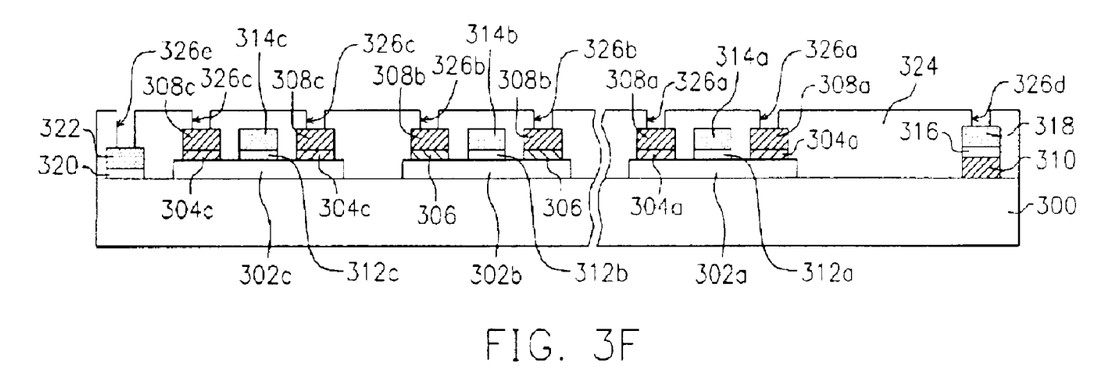

As shown in FIG. 3F, a protection layer 324 is formed over the substrate 300. The protection layer 324 is patterned in a fifth masking process (Mask 5). The protection layer 324 has a plurality of openings such as 326a, 326b, 326c, 326c, 326d and 326e. The opening 326a exposes the source/drain terminal 308a; the opening 326b exposes the source/drain terminal 308b; the opening 326c exposes the source/drain terminal 308c; the opening 326d exposes the upper electrode 318 of the storage capacitor and the opening 326e exposes the wiring line 322.

Figure 3G:
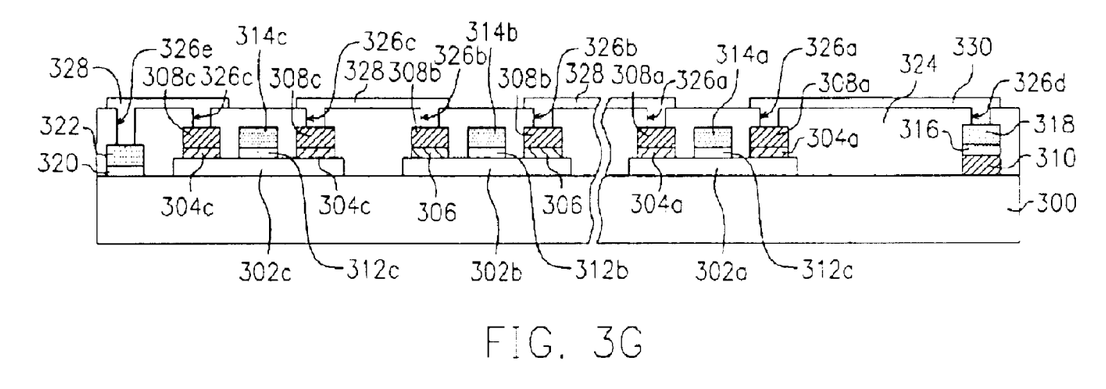

As shown in FIG. 3G, a conductive layer (not shown) is formed over the substrate 300. In general, the conductive layer is a transparent layer made from indium-tin oxide material. The conductive layer is patterned in a sixth masking process (Mask 6) to form a conductive wire 328 and a pixel electrode 330.

Figure 3H:
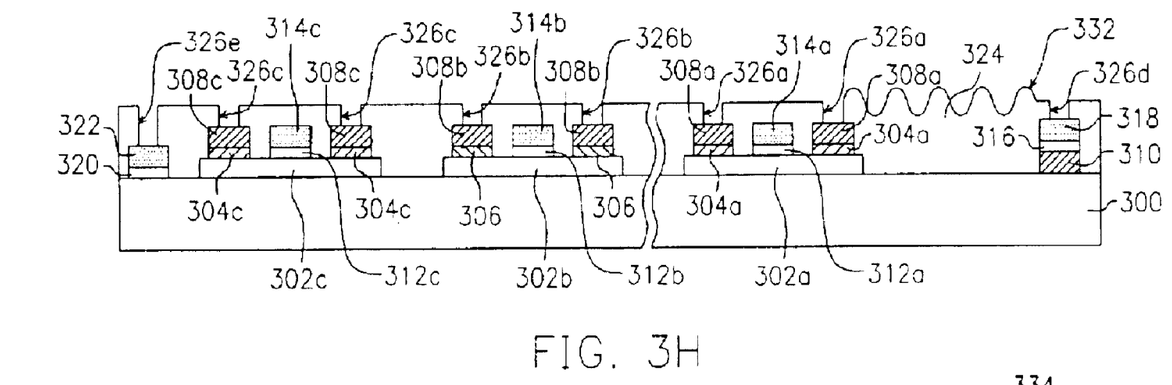
Figure 3I:
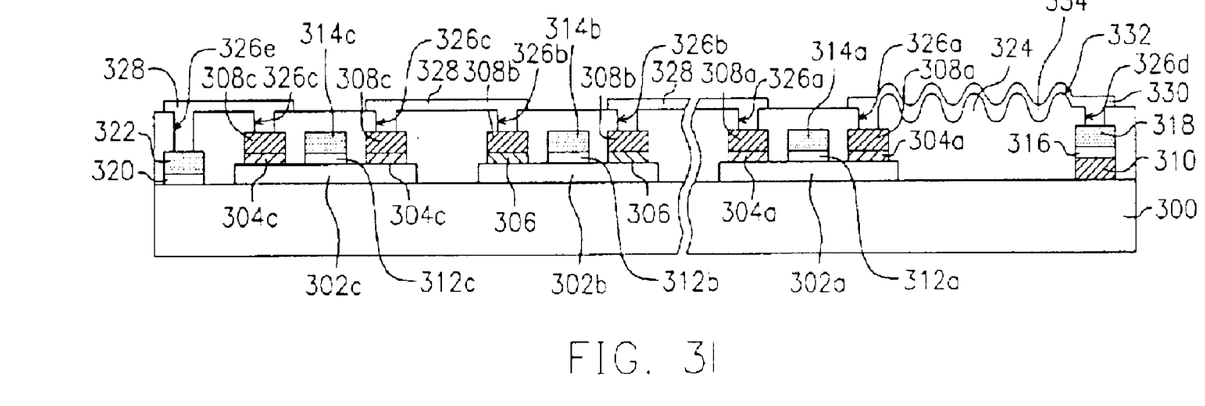

The structures shown in FIGS. 3H and 3I are very similar to the ones shown in FIGS. 3F and 3G. The major difference is that the structure in FIGS. 3H and 3I has a reflective panel while the structure in FIGS. 3F and 3G has a transparent panel. The protection layer 324 in FIGS. 3H and 3I has a roughened surface 332. In addition, the pixel electrode 334 over the roughened surface 332 is made using a highly conductive material. Through the roughened surface 332 of the protection layer 324, reflectivity of the pixel electrode (reflective electrode) 334 is boosted.

As shown on the left side of FIGS. 3G and 3I, the polysilicon layer 302c, the N+ doped thin film 304c, the source/drain terminal 308c, the gate insulation layer 312c and the gate 314c together constitute an N-type metal-oxide-semiconductor (NMOS) transistor. Similarly, the polysilicon layer 302b, the P+ doped thin film 306, the source/drain terminal 308b, the gate insulation layer 312b and the gate 314b together constitute a P-type metal-oxide-semiconductor (PMOS) transistor. The aforementioned NMOS transistor and PMOS transistor together form a complementary metal-oxide-semiconductor (CMOS) transistor. The CMOS transistor is a driving circuit for driving the thin film transistor shown on the right side of FIGS. 3G and 3I and hence controlling pixel display.

As shown on the right side of FIGS. 3G and 3I, the polysilicon layer 302a, the N+ doped thin film 304a, the source/drain terminal 308a, the gate insulation layer 312a and the gate 314a together form a polysilicon thin film transistor. Through the aforementioned CMOS driving circuit, the thin film transistor controls the writing of data to the pixel electrode 330 or the pixel electrode 334.

Figure 4:
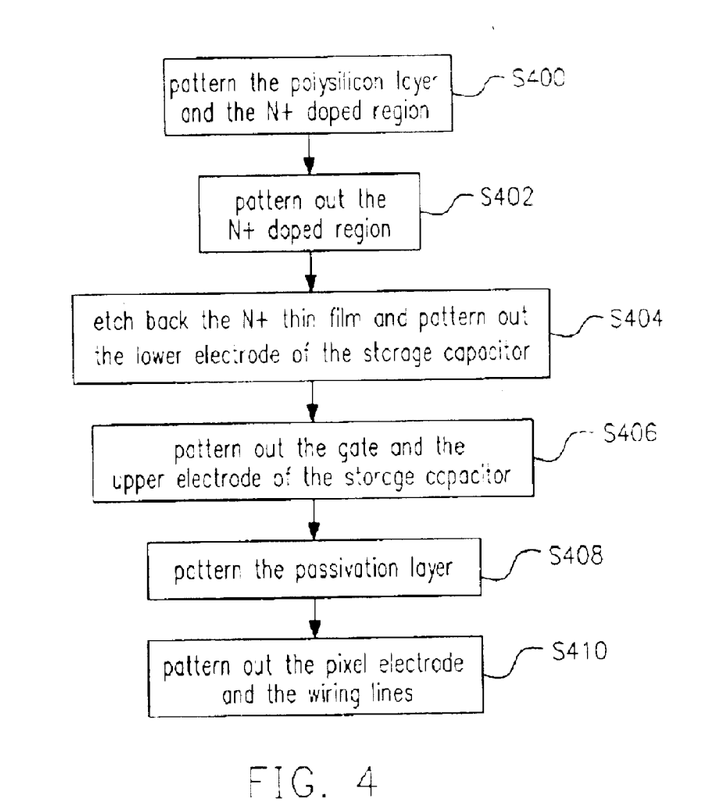
FIG. 4 is a flow chart showing the steps for fabricating a thin film transistor array and driving circuit according to one preferred embodiment of this invention.

FIG. 4 is a flow chart showing the steps for fabricating a thin film transistor array and driving circuit according to one preferred embodiment of this invention. The fabrication of the thin film transistor array and driving circuit comprises the steps of: patterning a polysilicon layer (S400); patterning out a P+ doped region (S402); patterning out source/drain terminals, etching back the N+ doped thin film and forming the lower electrode of a storage capacitor (S404); patterning out gates and the upper electrode of the storage capacitor (S406); patterning a passivation layer (S408) and patterning out pixel electrodes and wiring lines (S410). Altogether six masking processes are carried out from step S400 to S410 in the fabrication. However, if the NMOS transistor inside the driving circuit needs to have an N− doped region (lightly doped region), one more masking step is required.

Figure 5:
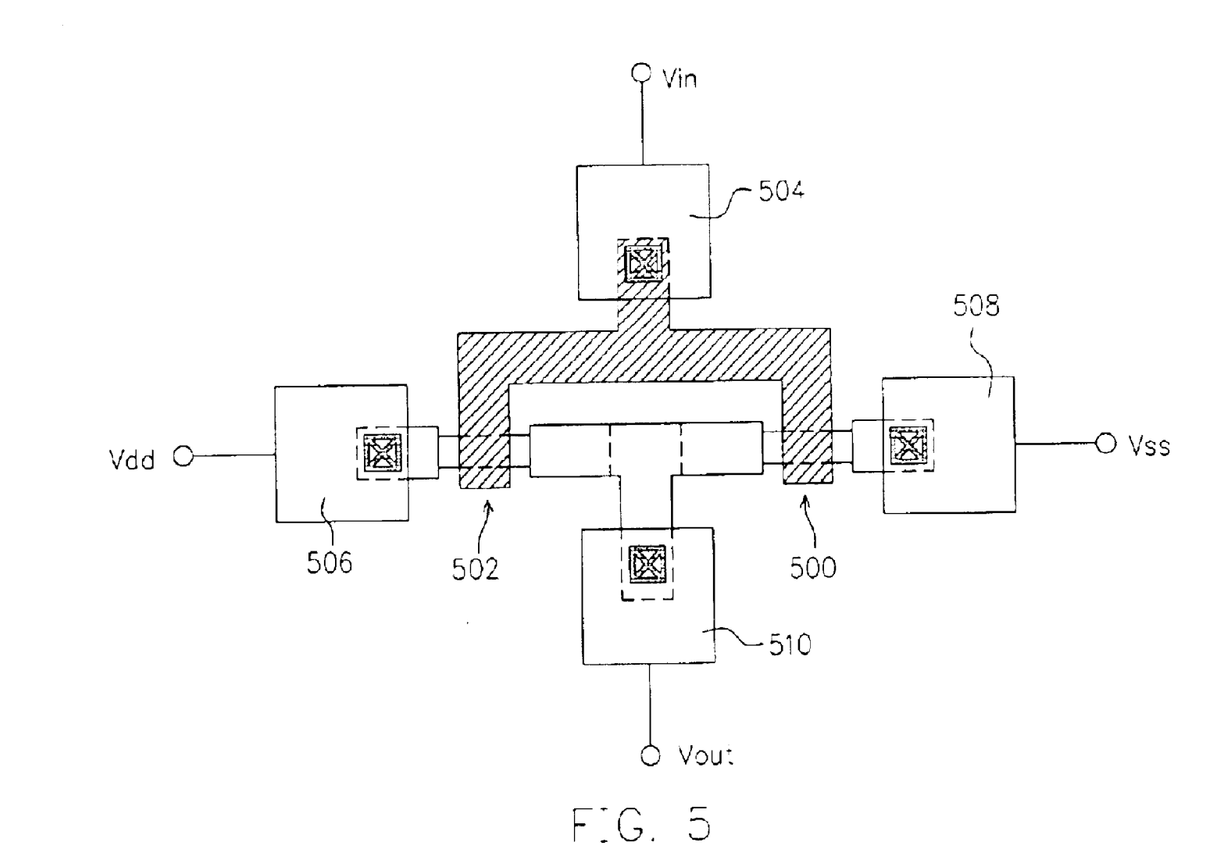
FIG. 5 is a top view showing the layout of a CMOS according to one preferred embodiment of this invention.

FIG. 5 is a top view showing the layout of a CMOS according to one preferred embodiment of this invention. As shown in FIG. 5, voltages $V_{in}$, $V_{dd}$ and $V_{ss}$ are applied to the respective contacts 504, 506 and 508. Since the contact 504 is electrically connected to the gates 500 and 502, the voltage $V_{in}$ applied to the contact 504 controls the channel conductance of both the NMOS transistor and the PMOS transistor. The channel conductance of the NMOS and PMOS (CMOS) transistor in turn affects the output voltage $V_{out}$ from the contact 510. Hence, the output voltage $V_{out}$ from the contact 510 can either be the voltage $V_{dd}$ or the voltage $V_{ss}$.

Yet, the driving circuit shown in FIG. 5 is only the layout of a CMOS unit. Anyone familiar with the technologies may combine the CMOS unit with other circuits or devices to drive the pixel array on a panel.

Figure 6:
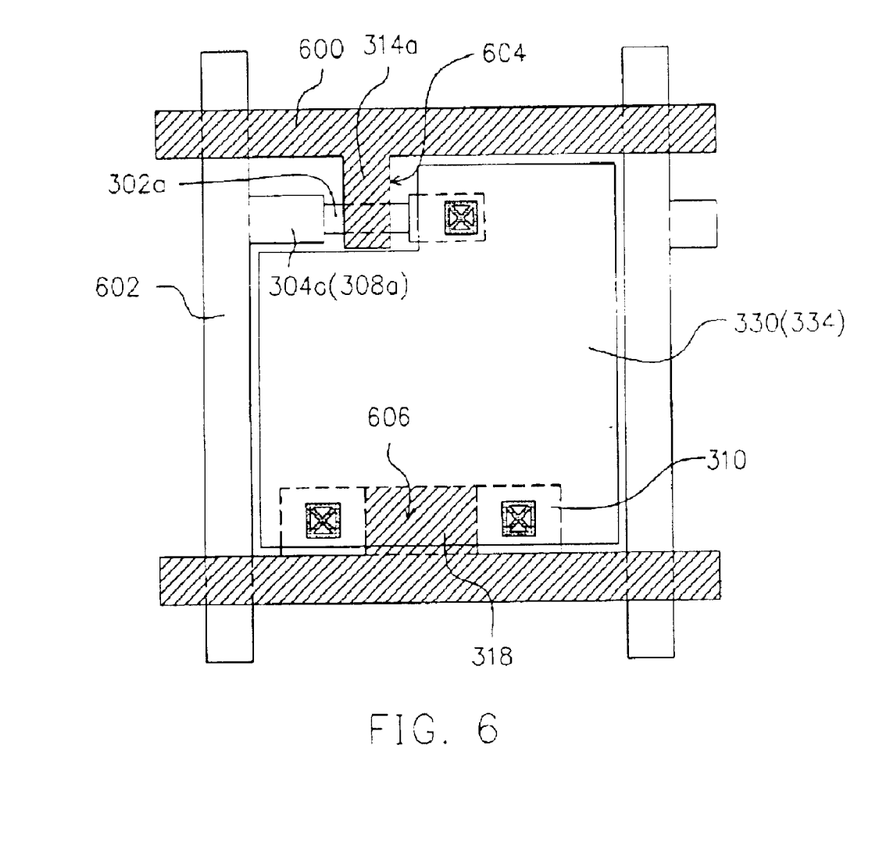
FIG. 6 is a top view showing the layout of a pixel according to one preferred embodiment of this invention.

FIG. 6 is a top view showing the layout of a pixel according to one preferred embodiment of this invention. As shown in FIG. 6, the pixel structure fabricated using the six masking steps mentioned in FIGS. 3A to 3I includes a scan line 600, a signal line 602, a thin film transistor 604, a storage capacitor 606 and a pixel electrode 330 (334). The thin film transistor 604 comprises a polysilicon layer 302a, a gate 314a, an N+ doped thin film 304a and a source/drain terminal 308a. In addition, the scan line 600 and the gate 314a of the thin film transistor 604 are electrically connected for controlling the switching of the lower channel layer (the polysilicon layer 302a). Data is transmitted through the signal line 602 and written into the pixel electrode 330 (334) under the control of the thin film transistor 604.

In summary, the structure of the thin film transistor array and driving circuits according to this invention has at least the following advantages:

1. Only six masking steps are required to fabricate the structure of the thin film transistor array and the driving circuit. Hence, production cost is reduced.
2. With a reduction in the number of masking steps in the fabrication of the structure, time required to produce a display panel is shortened.
3. Similarly, reliability and hence yield of the display panel improves with a reduction of masking steps in the fabrication of the structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor array and driving circuit structure fabricated on a substrate, comprising:

a plurality of scanning lines over the substrate;

a plurality of signaling lines over the substrate;

a plurality of thin film transistors supported over the substrate, wherein the thin film transistors are driven by the scanning lines and the signaling lines and each thin film transistor having:
    a polysilicon layer;
    a source/drain terminal over the polysilicon layer;
    a doped thin film between the polysilicon layer and the source/drain terminal;
    a gate over the polysilicon layer;
    a gate insulation layer between the polysilicon layer and the gate;

a plurality of pixel electrodes that corresponds to the thin film transistors;

a plurality of storage electrodes that correspond to the pixel electrodes; and a plurality of complementary metal-oxide-semiconductor (CMOS) transistors, wherein each CMOS transistor includes an N-type metal-oxide-semiconductor (NMOS) transistor and a P-type metal-oxide-semiconductor (PMOS) transistor.

2. The structure of claim 1, wherein the NMOS transistor further includes:

a second polysilicon layer;

a second source/drain terminal over the second polysilicon layer;

a second N+ doped thin film between the second polysilicon layer and the second source/drain terminal;

a second gate over the second polysilicon layer; and a second gate insulation layer between the second polysilicon layer and the second gate.

3. The structure of claim 1, wherein the polysilicon layer between the gate and the source/drain terminal further includes an N− doped region therein.

4. The structure of claim 1, wherein the PMOS transistor further includes:

a third polysilicon layer;

a third source/drain terminal over the third polysilicon layer;

a P+ doped thin film between the third polysilicon layer and the third source/drain terminal;

a third gate over the third polysilicon layer; and a third gate insulation layer between the third polysilicon layer and the third gate.

5. The structure of claim 1, wherein the gate insulation layer includes a dielectric layer.

6. The structure of claim 5, wherein material constituting the dielectric layer is selected from a group consisting of silicon oxide, silicon nitride and hydrogen-containing dielectric material.

7. The structure of claim 1, wherein the gate insulation layer further includes:
   a first dielectric layer; and
   a second dielectric layer over the first dielectric layer.

8. The structure of claim 7, wherein material constituting the first dielectric layer is selected from a group consisting of silicon oxide, silicon nitride and hydrogen-containing dielectric material.

9. The structure of claim 7, wherein material constituting the second dielectric layer includes a photosensitive resin.

10. The structure of claim 1, wherein material constituting the gate is selected from a group consisting of aluminum/molybdenum alloy and aluminum/titanium alloy.

11. The structure of claim 1, wherein material constituting the source/drain terminal is selected from a group consisting of an aluminum/molybdenum alloy and pure molybdenum.

12. The structure of claim 1, wherein the pixel electrodes are transparent electrodes.

13. The structure of claim 12, wherein material constituting the pixel electrodes includes indium-tin oxide.

14. The structure of claim 1, wherein the pixel electrodes are reflective electrodes.

15. The structure of claim 14, wherein material constituting the pixel electrodes includes metallic material.

16. A thin film transistor structure, comprising:
   a polysilicon layer;
   a source/drain terminal over the polysilicon layer;
   a doped thin film between the polysilicon layer and the source/drain terminal;
   a gate over the polysilicon layer; and
   a gate insulation layer between the polysilicon layer and the gate, wherein the gate and gate insulation layer have edges that are aligned in a stack structure formed in a same masking process.

17. The structure of claim 16, wherein the gate insulation layer includes a dielectric layer.

18. The structure of claim 17, wherein material constituting the dielectric layer is selected from a group consisting of silicon oxide, silicon nitride and hydrogen-containing dielectric material.

19. The structure of claim 16, wherein the gate insulation layer further includes:
   a first dielectric layer; and
   a second dielectric layer over the first dielectric layer.

20. The structure of claim 19, wherein material constituting the first dielectric layer is selected from a group consisting of silicon oxide, silicon nitride and hydrogen-containing dielectric material.

21. The structure of claim 19, wherein material constituting the second dielectric layer includes a photosensitive resin.

22. The structure of claim 16, wherein material constituting the gate is selected from a group consisting of aluminum/molybdenum alloy and aluminum/titanium alloy.

23. The structure of claim 16, wherein material constituting the source/drain terminal is selected from a group consisting of an aluminum/molybdenum alloy and pure molybdenum.

24. The structure of claim 16, wherein the doped thin film comprises at least one of N type and P type.

25. The structure of claim 16, further comprising a substrate supporting the polysilicon layer over the substrate.

26. A complementary metal-oxide-semiconductor (CMOS) structure on a substrate, comprising:
   an N-type metal-oxide-semiconductor (NMOS) transistor, having:
      a first polysilicon layer over;
      a first source/drain terminal over the first polysilicon layer;
      a first N+ doped thin film between the first polysilicon layer and the first source/drain terminal;
      a first gate over the first polysilicon layer;
      a first gate insulation layer between the first polysilicon layer and the first gate;
   a P-type metal-oxide-semiconductor (PMOS) transistor, having:
      a second polysilicon layer on the substrate;
      a second source/drain terminal over the second polysilicon layer;
      a second N+ doped thin film between the second polysilicon layer and the second source/drain terminal;
      a second gate over the second polysilicon layer; and
      a second gate insulation layer between the second polysilicon layer and the second gate.

27. The CMOS structure of claim 26, wherein the polysilicon layer between the first gate and the first source/drain terminal further includes an N− doped region therein.

28. A process of fabricating a transistor, comprising the steps of:
   providing a polysilicon layer;
   providing a source/drain terminal over the polysilicon layer;
   providing a doped thin film between the polysilicon layer and the source/drain terminal;
   providing a gate over the polysilicon layer; and
   providing a gate insulation layer between the polysilicon layer and the gate, wherein the gate and gate insulation layer are formed in a same masking process.

* * * * *